(12) United States Patent
Tegenbosch

(10) Patent No.: US 7,382,440 B2
(45) Date of Patent: Jun. 3, 2008

(54) LITHOGRAPHIC APPARATUS AND DEVICE MANUFACTURING METHOD

(75) Inventor: Henricus Gerardus Tegenbosch, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 132 days.

(21) Appl. No.: 10/980,835

(22) Filed: Nov. 4, 2004

(65) Prior Publication Data

US 2005/0151948 A1 Jul. 14, 2005

(30) Foreign Application Priority Data

Nov. 5, 2003 (EP) .................. 03078503

(51) Int. Cl.
*G03B 27/58* (2006.01)
*G03B 27/42* (2006.01)
*G03B 27/32* (2006.01)

(52) U.S. Cl. .............. 355/72; 355/53; 355/77; 310/12; 318/135

(58) Field of Classification Search .......... 355/53, 355/72, 75, 77; 310/10, 12, 112; 378/34, 378/35; 318/135
See application file for complete search history.

(56) References Cited

U.S. PATENT DOCUMENTS 4,413,864 A * 11/1983 Phillips .............. 384/12
4,985,651 A * 1/1991 Chitayat .............. 310/12
5,040,431 A * 8/1991 Sakino et al. ............ 74/490.09
5,699,621 A * 12/1997 Trumper et al. .......... 33/1 M
6,337,484 B1 * 1/2002 Loopstra et al. ....... 250/442.11
6,366,342 B2 * 4/2002 Tanaka .................. 355/75
6,750,571 B2 * 6/2004 Tominaga et al. ........ 310/12
2001/0050341 A1 * 12/2001 Kwan et al. ............ 250/491.1
2002/0070699 A1 * 6/2002 Tanaka et al. ............ 318/687
2002/0163630 A1   11/2002 Bisschops et al.
2003/0030778 A1 * 2/2003 Novak ................ 355/53
2004/0155543 A1 * 8/2004 Christoph ............ 310/90

FOREIGN PATENT DOCUMENTS

EP     1 357 432 A2    10/2003

* cited by examiner

*Primary Examiner*—Alan A. Mathews
(74) *Attorney, Agent, or Firm*—Pillsbury Winthrop Shaw Pittman, LLP

(57) ABSTRACT

A transporter is provided for moving a substrate and a patterning device relative to one another in a lithographic apparatus. The transporter includes a beam, a driver, and a slide. The slide is supported by the beam, and the driver is disposed to move the slide relative to the beam in a transport direction. The beam has a concave interior surface transverse to the transport direction, and the slide is supported against the concave interior surface in at least two directions transverse to the transport direction.

20 Claims, 5 Drawing Sheets

LITHOGRAPHIC APPARATUS AND DEVICE MANUFACTURING METHOD

CROSS-REFERENCE TO RELATED APPLICATIONS

This application claims the benefit of priority from European Patent Application No. 3078503.4, filed on Nov. 5, 2003, the entire content of which is incorporated herein by reference.

FIELD

The present invention relates to a lithographic apparatus, a linear motor and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one, or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

PCT patent application No. WO 99/34257 discloses a transport mechanism for transporting the substrate in a horizontal (XY) plane relative to a remainder of the apparatus.

High stiffness and small size of such transport mechanisms are characteristic parameters for use in a lithographic apparatus. The size may be limited by the space available in the apparatus. The stiffness determines the maximum acceleration that may be used, in view of distortion and resonances, and thereby influences the throughput of the apparatus. To get a high throughput, a high stiffness is desirable. The stiffness of the transport mechanism depends, at least on part, on the stiffness of the beam, which in turn depends on the elasticity of the beam and its moment of inertia. The beam is often made of almost inelastic ceramic material to achieve a high stiffness. Use of ceramic material makes the transport mechanism expensive. Moreover, even when an almost inelastic material is used, there is still a need to achieve higher stiffness.

A further problem with this type of transport mechanism is that it is typically manufactured to very high tolerances. Deformations may cause the slide to jam on the beam.

SUMMARY

It is an aspect of the present invention to increase the stiffness of the beam of a transport mechanism that occupies a given space, particularly within the lithographic apparatus.

It is an aspect of the present invention to reduce the weight of the transport mechanism for a given stiffness.

It is an aspect of the present invention to increase the load that may be carried by a transport mechanism that occupies a given space, particularly within the lithographic apparatus.

It is an aspect of the present invention to reduce the tolerances in the support of the slide.

According to an embodiment of the invention, there is provided a lithographic apparatus. The lithographic apparatus includes an illumination system for conditioning a beam of radiation, and a support for supporting a patterning device. The patterning device serves to impart the beam of radiation with a pattern in its cross-section. The apparatus also includes a substrate table for holding a substrate, a projection system for projecting the patterned beam onto a target portion of the substrate, and a transporter for moving the substrate and the patterning device relative to one another. The transporter includes a beam, a driver, and a slide. The slide is supported by the beam, and the driver is disposed to move the slide relative to the beam in a transport direction. The beam has a concave interior surface transverse to the transport direction, and the slide is supported against the concave interior surface in at least two directions transverse to the transport direction.

According to an embodiment of the invention, there is provided a linear motor for use in a lithographic apparatus. The linear motor includes a beam extending in a transport direction of the motor. The beam has a concave interior surface transverse to a transport direction. The motor also includes a slide having a body part supported against the concave interior surface in at least two directions transverse to the transport direction, and an extension that extends outside an interior space of the beam, for supporting a payload that is moved by the motor. The motor further includes a plurality of magnets that are positioned to move the slide relative to the beam in the transport direction.

According to an embodiment of the invention, the slide is supported at least partly against an interior surface of the beam, so that a supported part of the slide is in an interior space of the beam. Thus, in a transport mechanism that occupies a given space, the beam may have a larger spatial extent than if the slide surrounds the beam. This increases the moment of inertia of the beam for a given mass. In addition, a greater mass of material may be used in the beam, which also increases the moment of inertia. In an embodiment, the beam entirely surrounds the part of the slide that it supports, except for a slot for an extension of the slide that supports the substrate (or the mask). In this way, the moment of inertia is maximized. Typically the slide and the beam form part of a linear motor with interacting stator and transporter parts for moving the slide relative to the beam. The slide includes one of the interacting parts of the linear motor and the beam includes the other interacting part. The interacting part of the motor that is attached to the slide does not have be provided in the interior of the beam.

In an embodiment, the interacting part of the motor that is attached to the slide is placed on the slide outside the beam between a support area for the substrate or patterning device and the beam. When the center of mass of the slide is outside the beam, near the substrate or patterning device this reduces the torque on the slide, and resulting distortions.

Typically, the motor includes an interacting part with a magnet (generally an electromagnet) on the slide, which interacts with the beam to drive the beam in a known manner. The magnet may be placed so that the motor provides a pretension for a gas bearing that supports the slide against the beam inside the beam. Because no additional element is needed for providing pretension, the volume of the slide may be minimized, thereby leaving more volume for the beam. This may be particularly useful when the magnet is mounted next to the beam in a horizontal position, to provide pretension in a direction in which gravity does not provide pretension.

In an embodiment, the magnet is placed on an extension of the slide that extends outside the beam through a slot in the beam. In one embodiment, the slot is disposed so as to preserve symmetry of the beam. In this embodiment the magnet acts with substantially equal force on both sides of the slot, thus providing maximal forces and minimizing deformation. In another embodiment, the beam has sidewalls disposed so that its cross section transverse to the transport direction or at least a parallelogram, the slot being disposed in a first sidewall, substantially flush with a second sidewall that intersects the first sidewall at an angle (typically of substantially 90 degrees). In this way, a beam of maximum stiffness may be realized.

In an embodiment, the slide is supported against the beam by a gas bearing that is coupled to the slide by a joint that leaves freedom of movement to compensate for the effect of acceleration of the slide relative to the beam. Typically, a ball joint is used for the bearing that supports the slide against the beam on a first side opposite to a second side on which part of the motor and the substrate (or mask) are located. A ball joint permits full freedom of rotation. As an alternative, joints that permit less freedom of rotation may be used, such as a pin joint that permits rotation only around an axis perpendicular to the plane of extent of the slide. All supports of the slide may be realized by using gas bearings that are attached to the slide with some freedom of movement. When the bearings are realized in an interior space of the beam, a relatively large bearing may be realized without affecting the circumference of the beam. This makes it possible to carry heavier loads with the slide.

According to a further embodiment of the invention, there is provided a device manufacturing method. The device manufacturing method includes patterning a beam of radiation with a patterning device, projecting the patterned beam of radiation onto a target portion of a substrate, and moving the substrate and the patterning device relative to one another with a transporter. The transporter includes a beam, a driver, and a slide. The slide is supported by the beam, and the driver is disposed to move the slide relative to the beam in a transport direction. The slide is supported against a concave interior surface of the beam transverse to the transport direction during the moving. The slide is supported against the concave interior surface in at least two directions transverse to the transport direction.

In an embodiment, a transporter for moving a substrate and a patterning device relative to one another in a lithographic apparatus is provided. The transporter includes a beam, a driver, and a slide. The slide is supported by the beam, and the driver is disposed to move the slide relative to the beam in a transport direction. The beam has a concave interior surface transverse to the transport direction, and the slide is supported against the concave interior surface in at least two directions transverse to the transport direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
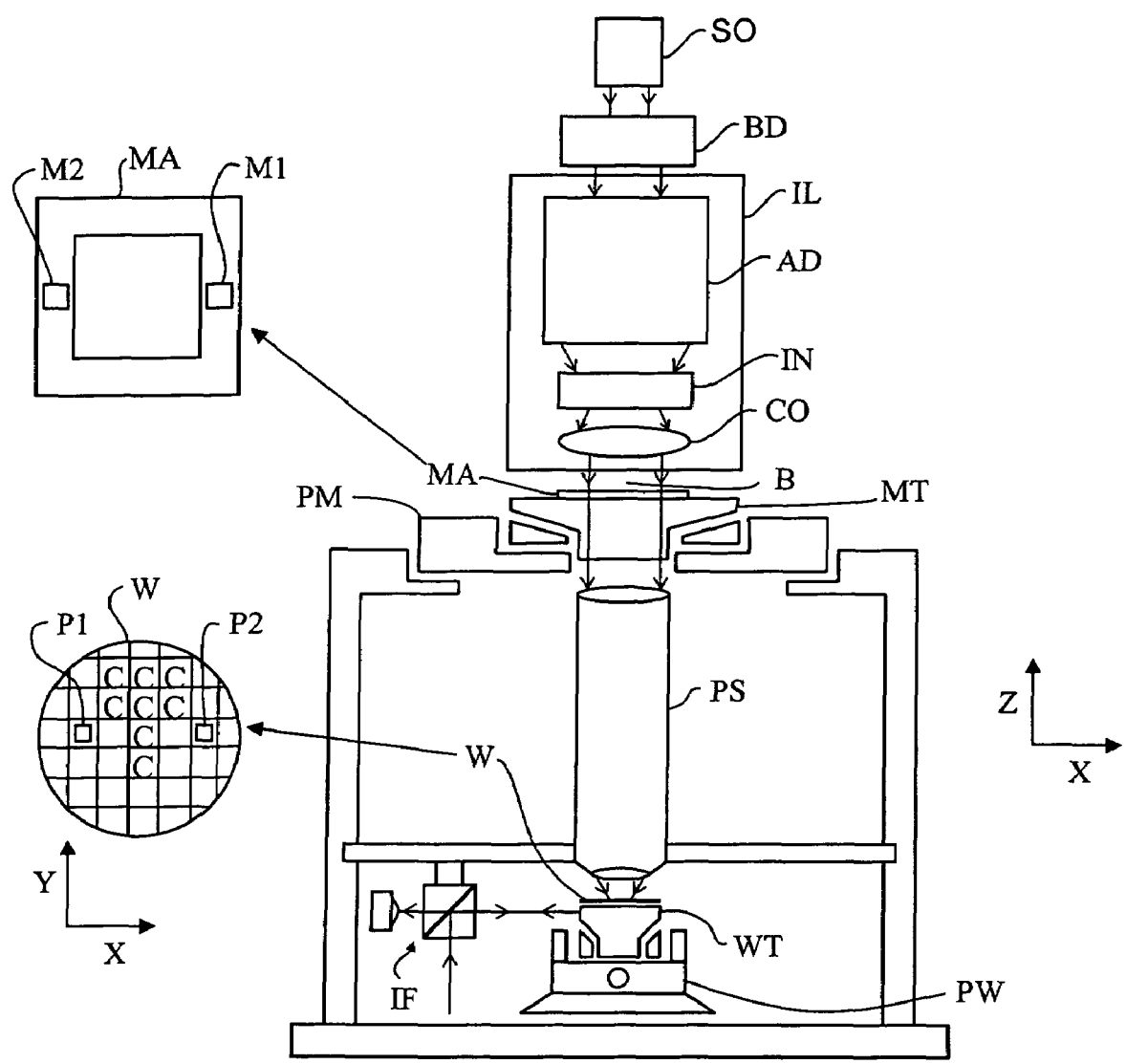
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam B of radiation (e.g. UV radiation); a first support structure (e.g. a mask table) MT for supporting a patterning device (e.g. a mask) MA and connected to first positioner PM for accurately positioning the patterning device with respect to item PS; a substrate table (e.g. a wafer table) WT for holding a substrate (e.g. a resist-coated wafer) W and connected to second positioner PW for accurately positioning the substrate with respect to item PS; and a projection system (e.g. a refractive projection lens) PS for imaging a pattern imparted to the projection beam B by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be integral part of the apparatus, for example, when the source is a mercury lamp. The source SO and the illuminator IL, together with the beam delivery system BD if required, may be referred to as a radiation system.

The illuminator IL may include an adjusting device AD for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam B, having a desired uniformity and intensity distribution in its cross-section.

The projection beam B is incident on the mask MA, which is held on the mask table MT. Having traversed the mask MA, the projection beam B passes through the lens PS, which focuses the beam onto a target portion C of the substrate W. With the aid of the second positioner PW and position sensor IF (e.g. an interferometric device), the substrate table WT can be moved accurately, e.g. so as to position different target portions C in the path of the beam B. Similarly, the first positioner PM and another position sensor (which is not explicitly depicted in FIG. 1) can be used to accurately position the mask MA with respect to the path of the beam B, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following example modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Figure 2:
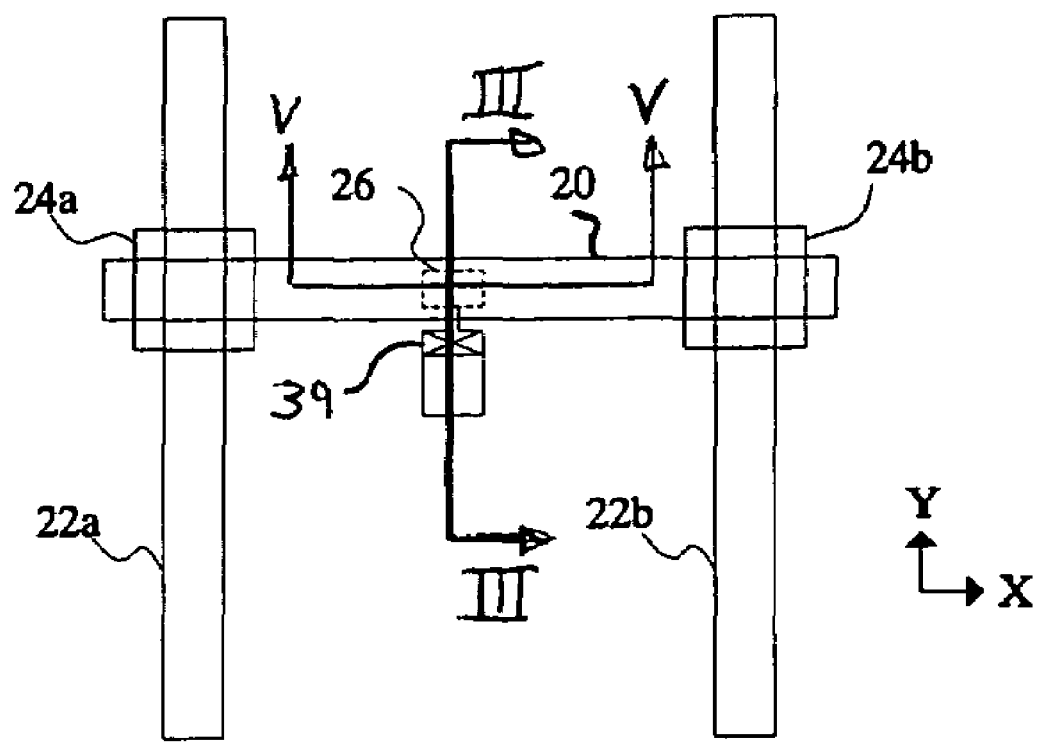
FIG. 2 shows a transporter of the apparatus of FIG. 1.

FIG. 2 shows a top view of an example of a transport structure, or transporter, that may be used as the positioner PW for positioning the substrate W relative to the patterning device MA. A similar transport structure may be used as the positioner PM for the mask. The transport structure includes three linear motors with beams 20, 22a, 22b, one linear motor with beam 20 for transport in a first (X-) direction and two linear motors with beams 22a, 22b for transport in a second (Y-) direction. On beams 22a, 22b for transport in the Y-direction, conventional slides 24a, 24b are shown, which are moved along beams 22a, 22b under influence of (electro-)magnets on beams 22a, 22b and on slides 24a, 24b. Beam 20 for transport in the X-direction is hollow. A slide 26 is provided that contains a part (shown by dashed lines) which supports slide 26 on beam 20 and which is almost completely enclosed in an interior part of beam 20.

Figure 3:
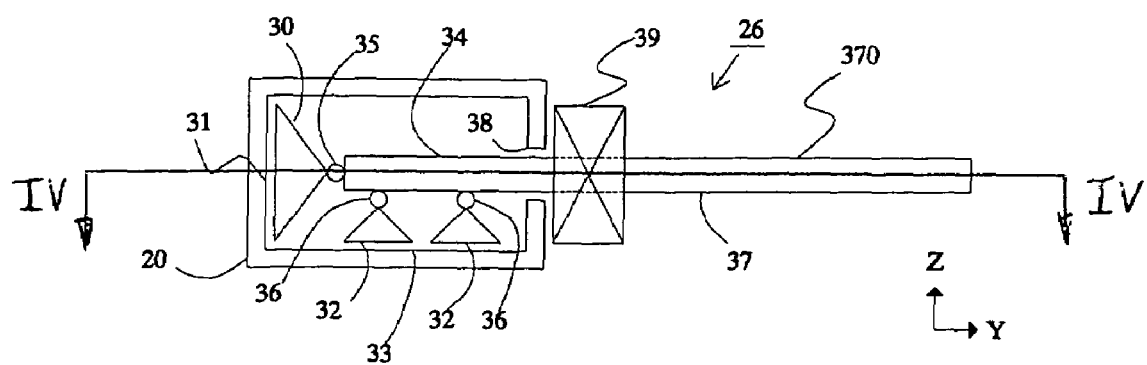
FIG. 3 shows a cross-section of the transporter of FIG. 2 along line III-III.

FIG. 3 shows a cross-section of beam 20 and slide 26 in the Y-Z plane (the Z-direction being perpendicular to the plane of drawing of FIG. 2) along line III-III, i.e. in a plane perpendicular to the direction of movement. The part of slide 26 that is contained in the interior of beam 20 includes first gas bearings 30 (one shown) that support slide 26 against a vertical interior wall 31 of beam 20 (the surface plane of wall 31 extends in the Y and Z directions), and second gas bearings 32 that support slide 26 against a horizontal interior wall 33 of beam 20 (the surface plane of wall 33 extends in the X and Y directions). The first gas bearings 30 are each attached to a body part 34 of slide 26 by first ball joints 35 (only one shown). Similarly, second gas bearings 32 are attached to body part 34 by ball joints 36. An extension 37 of slide 26 extends from body part 34 through a slot 38 in a vertical sidewall of beam 20. A translator part 39 of the motor for moving slide 26 along beam is attached to extension 37, which also includes a support surface 370 for substrate W.

Figure 4:
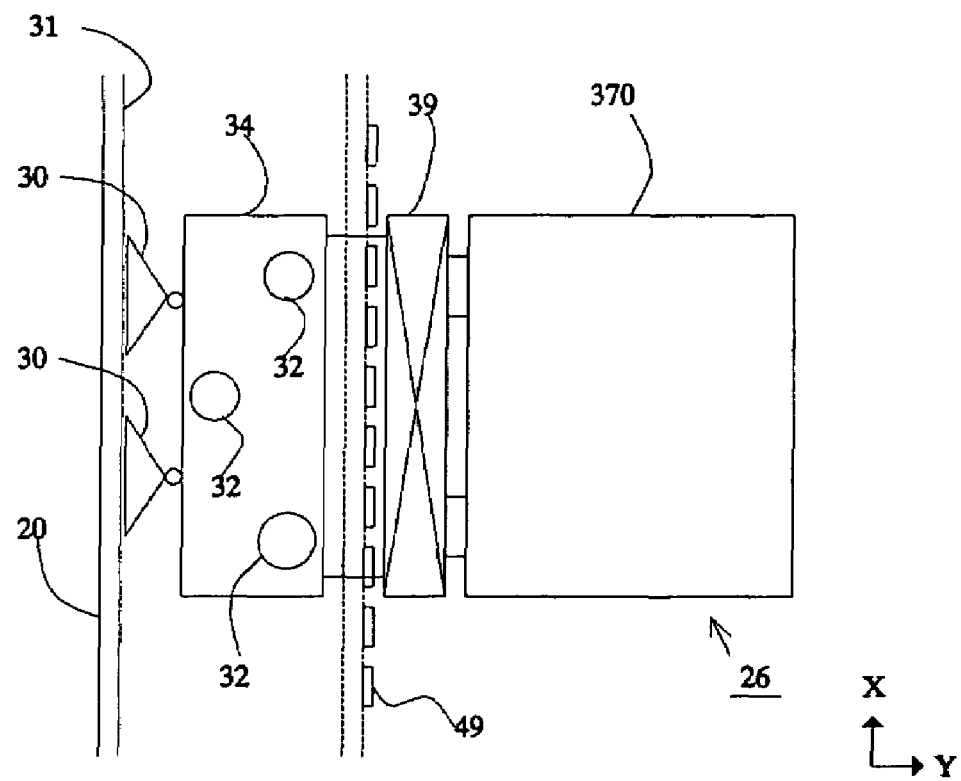
FIG. 4 shows a cross-section of the transporter of FIG. 3 along line IV-IV.

FIG. 4 shows a cross-section of beam 20 and slide 26 in the X-Y plane along line IV-IV. As can be seen, two gas bearings 30 are provided against wall 31. Not shown in the figures are cables for supplying current to the motor or supply connections for gas bearings 30, 32, which may be arranged in or outside beam 20. These elements may be located in the interior space of beam 20, so that beam 20 acts as a radiation shield for shielding radiation from these elements.

In operation, gas is supplied into the space between gas bearings 30, 32 and walls 31, 33, typically through openings (not shown) in the surface of the gas bearings 30, 32 that face the interior walls 31, 33 of beam 20. Slide 26 is slideably supported against the interior of beam 20 by the pressure of the gas in these spaces. Gas bearings 30, 32 typically work well only if the distance between their surface and the opposing surface 31, 33 of the wall is within a predetermined range, typically in the range of 5-30 micrometers. If the distance is too small, adhesion may occur; if the distance is too large, too much gas may escape.

Translator part 39 operates in a known way to move slide 26 along beam 20. For this purpose, translator part 39 generates magnetic fields which interact with beam 20. A row of permanent magnets 49 (not drawn to scale) may be attached to beam 20 on a surface that faces translator part 39, as shown in FIG. 4. Alternatively, the magnets 49 may be integrated in the surface. In an embodiment, rows of magnets are provided on beam 20 on either side of slot 38. Beam 20, or at least the part of beam to which the permanent magnets are attached (or in which they are integrated), may be made of magnetizable material, such as iron, to guide the magnetic flux between the attached permanent magnets.

Apart from moving slide 26 along beam 20, these magnetic fields that are generated by the translator part 39 also result in a pulling force upon translator 39 that acts to pull translator 39 towards beam 20. This force forces first air bearing 30 towards wall 31, providing a pretension that keeps the distance between first air bearing 30 and wall 31 in the functional operating range of air bearing 30. It will be realized that such a pretension may be provided by other means, even if translator 39 is placed inside beam 20, for example, by providing additional gas bearings to support slide 26 against the inside wall of beam 20 that faces vertical wall. However, use of the translator 39 to realize the pretension has the advantage that it involves less severe manufacturing tolerances.

One advantage of this construction is that the outline of beam 20 extends to the limits of the space that is available for the transport structure, which is much further when compared with a construction where slide 26 would be supported on the outside of beam 20. This makes it possible to realize a beam with a high stiffness, which in turn permits the use of high accelerations. The body part 34 of slide 26 that is supported against beam 20 may be almost entirely surrounded, except for slot 38 that is needed for extension 37. However, without deviating from the invention, beam 20 may be more open, as long as a concave part is present with walls 31, 33 against which slide 26 may be supported. In order to realize an optimal stiffness, beam 20 may be constructed of ceramic material, but due to its large extent, other, less stiff materials, such as steel, may already provide a good solution. The smaller extent of slide 26 also reduces the mass of the slide, which is may be advantageous in that smaller forces arise when slide 26 is accelerated.

A number of additional advantageous points may be noted. During acceleration of slide 26, a torque is exerted on slide 26, because the point of action of the motor (at translator 39) does not coincide with the center of mass of slide 26, which generally lies near the place where substrate W is supported. This torque may cause distortions of beam 20 and slide 26, which may result in unwanted resonance and even jamming of slide 26 against beam 20. By placing translator 39 outside beam 20, at a direction from the beam towards the center of mass, the torque and the distortion may be reduced.

The use of ball joints 35, 26 for the gas bearings 30, 32 is optional. In principle, direct gas bearings may be used, in which the gas layer is realized between walls 31, 33 and a surface that is rigidly attached to body part 34. However, use of joints, such as ball joints 35, 36 that permit freedom of rotation for this surface may reduce the risk that distortion of the slide 26 results in jamming. In the present embodiment, distortions of relative y-positions of parts of slide 26 are typically greater than distortions of relative x or z-positions, because slide 26 extends much further from its center of mass in the y-direction than in other directions. Therefore, it is preferred to use joints between body part 34 and the gas bearing at least for first gas bearings 30 that support against wall 31 that is transverse to the y-direction. Ball joints may be used in first gas bearings 30 in order to provide a maximum adaptability to distortion, but pin joints may be used instead that permit free rotation around the Z-axis but not around another axis. These already prevent most problems with distortion. When other types of distortion are most significant, it may be advantageous to provide gas bearings at least for surfaces other than vertical surface 31.

The use of additional joints such as ball bearings 35, 36, instead of a rigid coupling of body part 34 to the bearing surface, takes more space than a rigid coupling. However, because beam 20 is external to slide 26 and these joints, this space is not gained at the expense of the extent of the outer limits of beam 20, and thereby at the expense of its stiffness.

Figure 5:
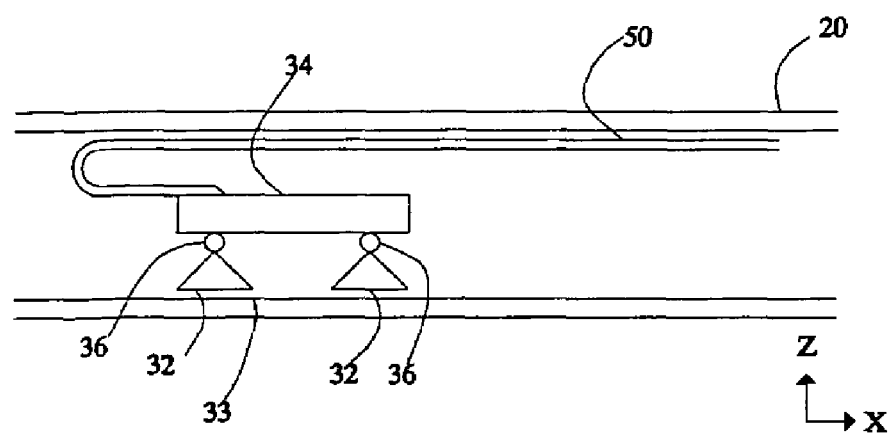
FIG. 5 shows a cross-section of the transporter of FIG. 2 along line V-V.

FIG. 5 shows a cross section of beam 20 and slide 26 in the XZ plane, along line V-V in FIG. 2. A cable 50 is shown for providing electric current for the motor. As shown, cable 50 is provided in the interior space in beam 20. This may minimize radiation to the outside (in particular heat radiation, but also from electromagnetic fields due to current through cable 50). A gas supply conduit for supplying gas to gas bearings 30, 32 may be disposed like cable 50 inside beam 20.

Figure 6:
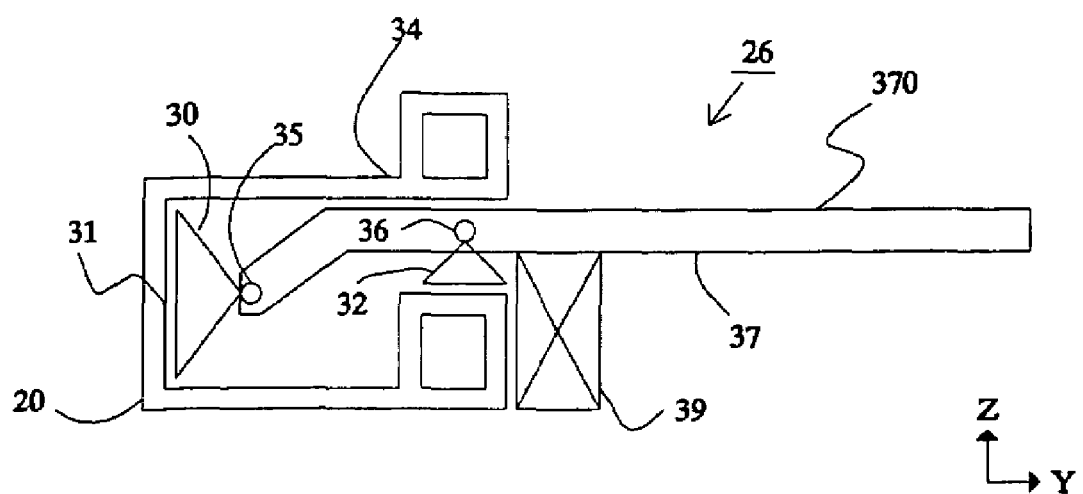
FIG. 6 shows a cross-section of another embodiment of a transporter of the apparatus of FIG. 1.

It will be understood that the invention is not limited to the structure shown in the preceding figures. FIG. 6 shows a YX cross-section of an alternative construction of slide 26 and beam 20. In this construction, the extension 37 of slide 26 extends through a slot 68 that is located substantially flush with the upper wall of beam 20. As a result, beam 20 has a greater stiffness against deformation in the Z-direction. Use of shafts 60, 62 on beam 20 on opposite sides of slot 68 may also increase stiffness. The magnet of translator part 39 acts on the wall of one of shafts 62, but the magnet of translator part 39 may also act on the other shaft or equally on both shafts 60, 62.

It may be noted that, compared to the embodiment of FIG. 6, the embodiment of FIG. 3 may have the advantage that slot 38 is located such that beam 30 is symmetrical around slot 38. In this configuration, translator part 39 exerts forces symmetrically on both sides of slot 38, which reduces deformation, keeps slide 26 in place with greater force and provides greater stiffness against deformation in the Y direction. Of course, shafts like shafts 60, 62 may be included in the embodiment of FIG. 3 as well.

Although use of a partly interior slide has been illustrated for X movement only (Y beams 22a,b having exterior slides), it will be realized that the invention may also be applied to movement along the Y-beams. However, the invention is most advantageous for the X-movement mechanism, because it is subjected to the greatest accelerations (both X and Y accelerations). Furthermore, although a photolithographic apparatus has been described, in which the stiffness and limited size of linear motors contribute to realizing accurate high speed exposure, it will be understood that this type of linear motor may also be used in other applications. Within a photolithographic apparatus, such linear motors may be provided for transporting substrates, but also for transporting reticles or masks.

Furthermore, it should be understood that, although the embodiments show a slide that moves relative to the beam, it will be understood that the words "slide" and "beam" should not be taken to exclude that the slide is fixed to a frame with the beam being moved. Also, although the slide has been described as including the translator part of a linear motor, it will be understood that in the same way, the beam could include the translator part and the slide the stator part.

While specific embodiments of the invention have been described above, it will be appreciated that the invention may be practiced otherwise than as described. The description is not intended to limit the invention.

What is claimed is:

1. A lithographic apparatus comprising:
    an illumination system constructed and arranged to condition radiation;
    a support constructed and arranged to support a patterning device, the patterning device being configured to impart the radiation with a pattern in its cross-section;
    a substrate table constructed and arranged to hold a substrate;
    a projection system constructed and arranged to project the patterned radiation onto a target portion of the substrate; and
    a transporter constructed and arranged to move the substrate relative to the patterning device or the patterning device relative to the substrate, the transporter comprising a beam, a driver, and a slide, the slide being supported by the beam, and the driver being disposed to move the slide relative to the beam in a transport direction,
    wherein the beam has an interior having a concave interior surface transverse to the transport direction, and the slide is at least partially enclosed in the interior of the beam and is supported against the concave interior surface in at least two directions transverse to the transport direction.

2. A lithographic apparatus according to claim 1, wherein the transporter comprises a motor coupled to the beam, configured to move the beam with the driver and the slide in a direction transverse to the transport direction.

3. A lithographic apparatus according to claim 1, wherein the beam is hollow with an interior surface whose cross-section transverse to the transport direction is closed except for a slot, said concave surface being part of the interior surface, and the slide has an extension extending through the slot outside the beam, said extension configured to support the substrate or the patterning device.

4. A lithographic apparatus according to claim 1, wherein the driver comprises a magnet attached to the slide facing a wall section of the beam, the wall section and/or magnets attached thereto configured to interact with the magnet attached to the slide to drive movement along the beam, the magnet attached to the slide being located on an extension of the slide outside an interior space of the beam, between a body part of the slide that supports the slide inside the interior space and a surface of the extension configured to support the substrate or the patterning device.

5. A lithographic apparatus according to claim 1, wherein the slide comprises a gas bearing surface configured to support the slide against a bearing part of the concave surface, the beam comprising a wall section, a supported body part of the slide being located between the wall section and said bearing part of the concave surface, the driver comprising a magnet attached to the slide facing the wall section, the wall section and/or magnets attached thereto configured to interact with the magnet attached to the slide to drive movement along the beam, said wall section being located between the magnet attached to the slide and said bearing part of the concave surface.

6. A lithographic apparatus according to claim 5, wherein said wall section is located in a horizontal path between the magnet and said bearing part of the concave surface.

7. A lithographic apparatus according to claim 1, wherein said slide comprises a gas bearing configured to support the slide against the interior concave surface, a joint coupling the gas bearing to a body part of the slide, the joint permitting rotation of the gas bearing relative to the body part around at least one axis of rotation.

8. A lithographic apparatus according to claim 7, wherein said joint is a ball joint permitting rotation in all directions.

9. A lithographic apparatus according to claim 7, wherein the slide has an extension that extends to an exterior of the beam in a horizontal direction, said gas bearing configured to support the slide against the interior concave surface with a force in said horizontal direction.

10. A lithographic apparatus according to claim 7, comprising gas bearings everywhere where the slide is supported against the beam, and joints rotatably coupling each of these gas bearings to the body part.

11. A lithographic apparatus according to claim 1, further comprising a cable to supply electric current to power the driver, at least a part of the cable extends along a length of the beam being located in the interior of the beam.

12. A linear motor for use in a lithographic apparatus, the linear motor comprising:
- a beam extending in a transport direction of the motor, the beam having an interior having a concave interior surface transverse to a transport direction;
- a slide having a body part at least partially enclosed in the interior of the beam and supported against the concave interior surface in at least two directions transverse to the transport direction, and an extension that extends outside an interior space of the beam, to support a payload that is moved by the motor; and
- a plurality of magnets positioned to move the slide relative to the beam in the transport direction.

13. A linear motor according to claim 12, wherein a first one of the magnets is attached to the slide facing a wall section of the beam, the wall section and/or magnets attached thereto configured to interact with the first magnet to drive movement along the beam, the first magnet being located on the extension outside the interior space of the beam, between the body part and the payload.

14. A linear motor according to claim 13, wherein the slide comprises a gas bearing surface configured to support the slide against a bearing part of the concave surface, the beam comprising a wall section, a supported body part of the slide being located between the wall section and said bearing part of the concave surface, the first magnet being attached to the slide facing the wall section, the wall section and/or magnets attached thereto configured to interact with the first magnet to drive movement along the beam, said wall section being located between the first magnet and said bearing part of the concave surface.

15. A linear motor according to claim 12, wherein said slide comprises:
- a gas bearing configured to support the slide against the interior concave surface,
- a joint coupling the gas bearing to a body part of the slide, the joint permitting rotation of the gas bearing relative to the body part around at least one axis of rotation.

16. A linear motor according to claim 12, further comprising a cable to supply electric current to the motor, at least a part of the cable extends along a length of the beam being located in the interior of the beam.

17. A device manufacturing method comprising:
- patterning radiation with a patterning device;
- projecting the patterned radiation onto a target portion of a substrate; and
- moving the substrate relative to the patterning device or the patterning device relative to the substrate with a beam, a driver, and a slide, the slide being supported by the beam, and the driver being disposed to move the slide relative to the beam in a transport direction,
- wherein the slide is at least partially enclosed in an interior of the beam and is supported against a concave interior surface of the beam transverse to the transport direction during said moving, the slide being supported against the concave interior surface in at least two directions transverse to the transport direction.

18. A device manufacturing method according to claim 17, further comprising:
- supporting the slide against a bearing part of the concave surface with a gas bearing; and
- providing a pretension on said gas bearing with a magnetic force exerted by the driver between the beam and the slide.

19. A device manufacturing method according to claim 17, further comprising:
- supporting the slide against the interior concave surface with a gas bearing that is coupled rotatably to a body part of the slide.

20. A transporter for moving a substrate relative to a patterning device or the patterning device relative to the substrate in a lithographic apparatus, the transporter comprising a beam, a driver, and a slide, the slide being supported by the beam, and the driver being disposed to move the slide relative to the beam in a transport direction, wherein the beam has an interior having a concave interior surface transverse to the transport direction, and the slide is at least partially enclosed in the interior of the beam and is supported against the concave interior surface in at least two directions transverse to the transport direction.

* * * * *